(12) United States Patent
Solovyov

(10) Patent No.: US 12,429,540 B2
(45) Date of Patent: Sep. 30, 2025

(54) CONDUCTION COOLED CRYOGENIC CURRENT SOURCE WITH A HIGH-TEMPERATURE SUPERCONDUCTING FILTER

(71) Applicant: Brookhaven Technology Group, Inc., Stony Brook, NY (US)

(72) Inventor: Vyacheslav Solovyov, Rocky Point, NY (US)

(73) Assignee: Brookhaven Technology Group, Inc., Stony Brook, NY (US)

( * ) Notice: Subject to any disclaimer, the term of this patent is extended or adjusted under 35 U.S.C. 154(b) by 221 days.

(21) Appl. No.: 17/902,860

(22) Filed: Sep. 4, 2022

(65) Prior Publication Data
US 2024/0077554 A1 Mar. 7, 2024

(51) Int. Cl.
| | | |
|---|---|---|
| G01R 33/3815 | (2006.01) |
| G01R 33/38 | (2006.01) |
| H01F 6/00 | (2006.01) |
| H01F 6/04 | (2006.01) |
| H02M 1/14 | (2006.01) |
| H02M 3/28 | (2006.01) |
| H02M 3/335 | (2006.01) |

(52) U.S. Cl.
CPC ..... *G01R 33/3815* (2013.01); *G01R 33/3804* (2013.01); *H01F 6/008* (2013.01); *H01F 6/04* (2013.01); *H02M 1/14* (2013.01); *H02M 3/285* (2013.01); *H02M 3/335* (2013.01)

(58) Field of Classification Search
CPC .......... G01R 33/3815; G01R 33/3856; G01R 33/3802; G01R 33/3806; H02J 3/185; H02M 3/285; H02M 3/335
USPC ............................................ 363/14; 323/360
See application file for complete search history.

(56) References Cited

U.S. PATENT DOCUMENTS

| | | | |
|---|---|---|---|
| 5,563,780 A * | 10/1996 | Goad | H02M 3/285 363/40 |
| 6,388,898 B1 * | 5/2002 | Fan | H02M 3/33561 363/20 |
| 8,036,009 B2 | 10/2011 | Cordes | |
| 2013/0083927 A1 * | 4/2013 | Savant | H04R 1/1025 381/74 |
| 2019/0086493 A1 * | 3/2019 | Cao | H03F 3/2178 |
| 2020/0083818 A1 * | 3/2020 | Lin | H02M 3/285 |
| 2020/0225301 A1 * | 7/2020 | Slade | G01R 33/3815 |

* cited by examiner

*Primary Examiner* — Alex Torres-Rivera
(74) *Attorney, Agent, or Firm* — Schroeder Law PC

(57) ABSTRACT

A regulated current source that provides high DC current and low voltage ripple to a superconducting electromagnet. The current source is a multi-phase synchronous rectifier, wherein the rectifying elements are cryogenically-cooled MOSFETS coupled with a superconducting filter.

6 Claims, 13 Drawing Sheets

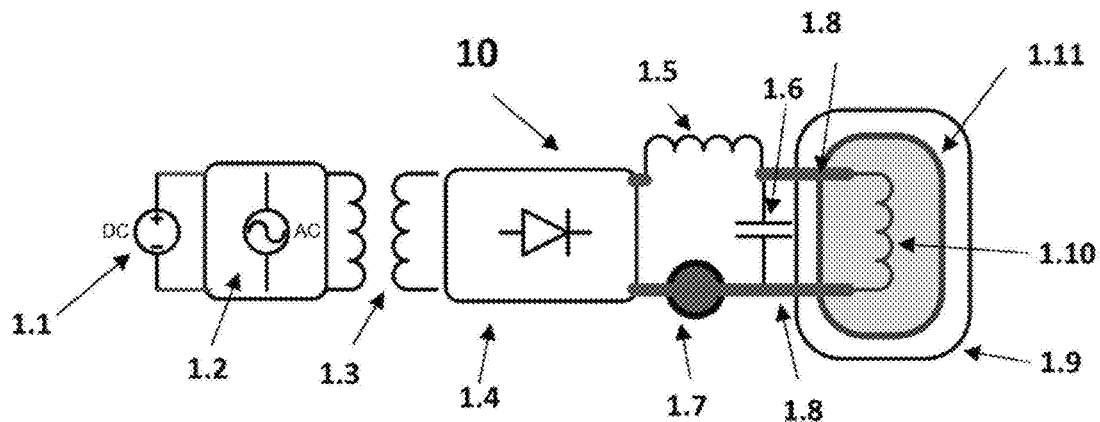
FIG. 1a. Traditional current delivery
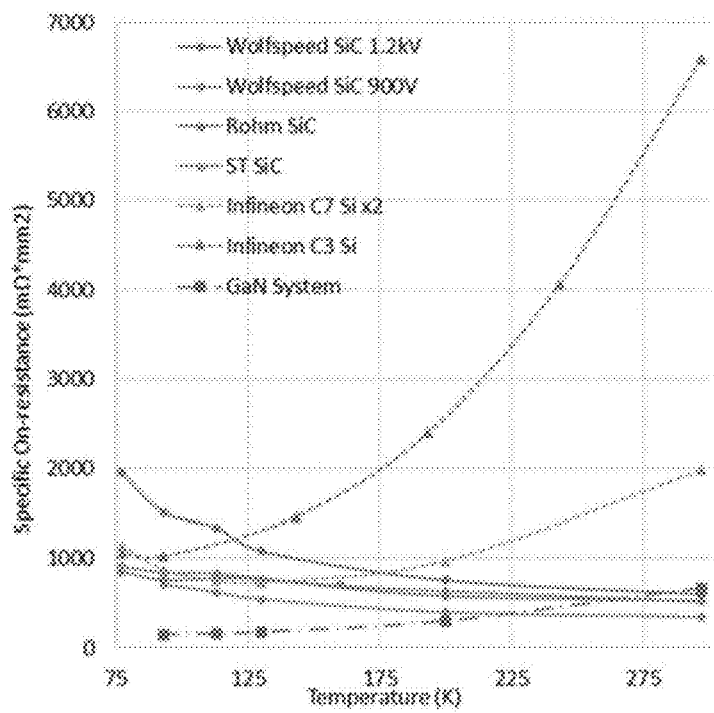
FIG. 1b

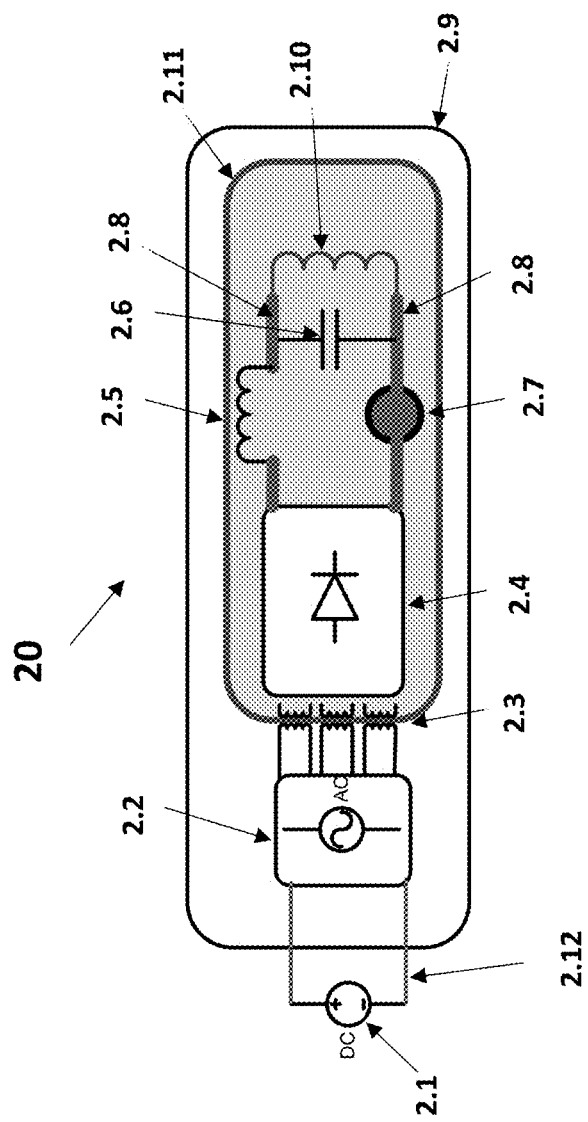
FIG. 2. In-vacuum current source

CONDUCTION COOLED CRYOGENIC CURRENT SOURCE WITH A HIGH-TEMPERATURE SUPERCONDUCTING FILTER

BACKGROUND OF THE INVENTION

The present invention relates to a regulated current source for powering conduction-cooled superconducting magnets that require low voltage ripple and, more particularly, to a current source capable of operating in a vacuum and requiring only high voltage DC power and USB data inputs.

Applications of superconducting magnets include nuclear spin tomography, nuclear magnetic resonance, fusion power plants, and many others. It is often desirable to wind a magnet from a multi-strand cable. Such a magnet sometimes needs several thousands of amperes to energize. Traditionally, the current to a magnet is delivered through a normal metal lead, which is cooled by an arrangement of thermal intercepts. As shown in FIG. 1a, in a traditional current delivery system, the primary DC high voltage supplied by a DC source 1.1 is stepped down through either a full-bridge or a flyback inverter 11.2 and a transformer 11.3. The high-current AC signal is rectified, filtered, and delivered to a superconducting magnet 1.10. Traditional current leads 1.8 thermally link cryogenic environment 1.9 and the ambient, generating loss through conduction.

In a normal metal, the thermal and electrical conductivities of metals are proportional, which is quantified in the Wiedemann-Franz Law (WF). The widely accepted normal metal current lead optimization methodology has been developed by McFee (McFee, R., Optimum Input Leads for Cryogenic Apparatus. Review of Scientific Instruments, 1959. 30(2): p. 98-102.). The McFee method can be reduced to solving two equations: (i) the minimum energy transmitted from room temperature to cryogenic temperature by passive conduction; and (ii) the ratio of length to the cross-sectional area of the current lead that delivers minimum thermal loss.

Cryogen-free conduction-cooled superconducting systems are increasingly being considered as an economical alternative to liquid helium-cooled systems. A conduction-cooled system has a limited cooling capacity. Typically, a large water-cooled cryo-compressor can deliver up to 100 W of cooling power at 60 K. Due to the limitations imposed by the WF law, the minimum loss is independent of the lead material and is 45 W for a conduction-cooled lead operating at 1,000 A (Ballarino, A., Current Leads, Links and Buses. CERN Yellow Report 2013. CERN-2014-005: p. 547-558). Thus, cooling only two 1,000 A current leads would require a separate 100 W cryo-compressor.

In superconductors, the WF law is violated by the formation of a coherent ground state and the opening of a gap in the excitation spectrum everywhere on the Fermi surface. This is why high-temperature superconducting (HTS) current leads are increasingly utilized to connect 60 K and 4 K environments. However, the HTS lead technology does not address the transition from room temperature to 60 K. Liquid nitrogen, LN2, pre-cooling of HTS leads is impractical in a situation where regular delivery of LN2 or installation of an LN2 plant is impossible.

So-called exciters flux pumps (Bumby, C W, R A Badcock, H.-J. Sung, K.-M. Kim, Z. Jiang, A. E. Pantoja, P. Bernardo, M. Park, and R. G. Buckley, Development of a brushless HTS exciter for a 10 kW HTS synchronous generator. Superconductor Science and Technology, 2016. 29(2): p. 024008) are often used to inject current into a magnet by subjecting a section of the conductor to a changing magnetic field. The exciters are capable of generating rather small (tens of millivolt) voltage on a coil. Therefore, only a magnet with low inductance can be charged in a reasonable time.

It has long been known that Si and GaN MOSFETS can be used to design a cryogenic synchronous rectifier circuit (CSRC). This is possible because, unlike a diode, a MOSFET is a unipolar (majority carrier) device. Upon cooling to 50-60 K, the channel resistance of an n-type MOSFET decreases ×2, which translates into low conduction loss. In contrast, the voltage across a Si diode increases upon cooling due to bandgap expansion. Further reduction of conduction loss can be achieved by parallel connection of rectifying MOSFETs. FIG. 1B shows the temperature dependence of channel resistance of Si, SiC, and GaN MOSFETS. Devices with a positive temperature coefficient of channel resistance, such as Si and GaN MOSFETs, can benefit from the parallel connection at cryogenic temperatures.

U.S. Pat. No. 8,036,009B2 (Method for supplying and discharging power to and from a resistive-inductive load, and rectifier) describes a MOSFET-based flux pump. The flux pump can be described as a CSRC with a resistive shunt (free-wheeling bypass) MOSFET switch. The purpose of the bypass is to lock the current in the magnet. Because the bypass is dissipating, energy stored in the magnet is continuously lost. This requires replenishing the magnet current. Thus, the current source is operated in pulsed mode, which also contributes to high voltage ripple of 100's of milliVolts. Current sources with such a high voltage ripple are not suitable for quality magnets, such as MRI, NMR and accelerators. Moreover, realizing a high-current bypass with ratings >1,000 A is challenging, which limits the applicability of flux pumps.

There is therefore a need in the art for a regulated current source that provides high DC current with reduced AC ripple to a superconducting magnet.

SUMMARY OF THE INVENTION

The present invention, which addresses the needs of the prior art, provides an in-vacuum current source for powering a conduction cooled superconducting magnet via a DC power source providing a low-current, high-voltage DC signal. The current source includes a first current source unit, the first current source unit including an inverter coupled to the DC power source for generating a high-frequency high-voltage AC signal from the low-current, high-voltage DC signal. The current source further includes a plurality of step-down transformers coupled to the inverter for stepping down the voltage of the AC signal. The current source further includes a cryogenic synchronous rectifier circuit coupled to the transformers for receiving and rectifying the stepped-down AC signal. The current source further includes a superconducting AC filter positioned between the cryogenic synchronous rectifier circuit and the superconducting magnet for reducing AC ripple and controlling voltage ripple. Finally, the current source includes a pair of high temperature superconducting leads for electrically connecting said superconducting magnet to said filter and to said cryogenic synchronous rectifier circuit.

The primary power is delivered as a high-voltage, low-current DC through a compact feedthrough. The high voltage AC power signal is stepped down by a matrix of phase-shifted inverters and transformers located in the cryo-chamber (in vacuum) and rectified by a CSRC thermally bonded to the first stage of a two-stage cryocooler or directly to a one-stage cryo-cooler via a thermal bridge. The multi-phase design of the invention addresses the most difficult problem encountered in the early designs of MOSFET-based cryogenic current sources (so-called flux pumps): exceptionally long discharge times of parasitic inductances in the steady-state mode of operation. The invention uses a superconducting AC filter coupled to the multi-phase CSRC. The filter is designed to reduce AC ripple by 40 dB and ensure that the voltage ripple on the coil is below 10 mV, which is the level acceptable for the operation of high-quality superconducting magnets.

As a result, the present invention provides a regulated current source that provides high DC current with reduced AC ripple to a superconducting magnet.

BRIEF DESCRIPTION OF THE DRAWINGS

FIG. 1a is a schematic of a traditional current delivery system for a superconducting magnet.

FIG. 1B is graph showing the temperature dependence of Si, GaN and SiC MOSFETs.

FIG. 2 is a schematic of a current source in accordance with the present invention.

DETAILED DESCRIPTION OF THE INVENTION

Figure 3:
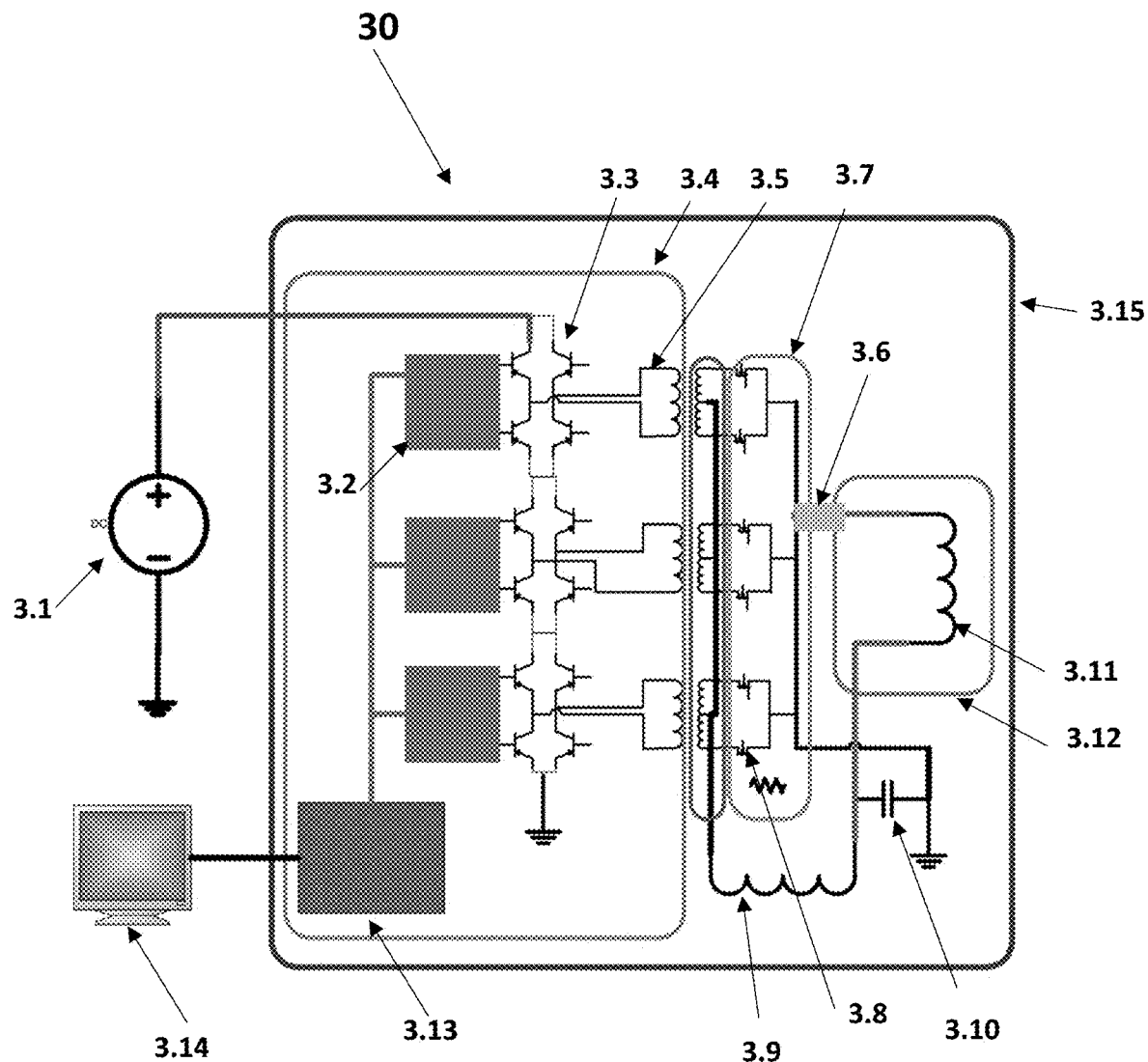
FIG. 3 is a schematic of one preferred embodiment of a current source in accordance with the present invention.

A schematic of a prior art traditional current delivery system 10 is shown in FIG. 1a. In the traditional scheme of powering a superconducting magnet, a DC power source 1.1 supplies power to an inverter 1.2, which generates a high-frequency high-voltage AC signal. The AC signal is then stepped-down by a transformer 1.3 to a level that is suitable for powering a superconducting magnet, and then rectified by a rectifier 1.4. The rectified signal is then filtered by an AC filter, comprised of an inductance 1.5 and a capacitor 1.6. The filter shown in FIG. 1a is typically referred to as a "first-order filter." More complex, high-order filters are often designed to improve the filtering. A superconducting coil 1.10, situated in a cryogenic environment 1.11, is energized via current leads 1.8. The cryogenic environment can be established by a bath of liquid cryogens (such as Helium) or by thermal linkage to a mechanical cooling apparatus (such as a Gifford-McMahon refrigerator). The cryogenic system is enclosed by a vacuum chamber 1.9 to minimize the passive heat loss to the ambient. A high-quality magnet needs a way to read the current with high precision, typically better than 100 parts per million. This is typically accomplished by a direct current transformer (DCCT) 1.7. In the configuration of FIG. 1a, the current leads 1.8 directly connect the cryogenic environment 1.11 to the ambient environment. The passive heat loss which occurs through the current leads is the major source of heat load in the cryogenic environment.

FIG. 2 shows a schematic of a current source 20 in accordance with the present invention. A DC power source 2.1 supplies low-current, high voltage DC power though light low-current leads 2.12 to an in-vacuum inverter 2.2. The inverter powers an array of step-down transformers 2.3. The signal is then rectified by a CSRC 2.4. The transformers are designed so that the primary windings are conduction-cooled by thermal linkage to the vacuum chamber 2.9, and to the ambient. The secondary windings of the transformers are cooled by a thermal linkage to the cryogenic refrigerator (cryo-head). Current source 20 includes a superconducting AC filter comprised of a radio-frequency superconducting solenoid 2.5 and a cryogenic-compatible capacitor 2.6 filter output of the rectifier 2.4. The coil current may be detected by an in-vacuum DCCT 2.7. A pair of high-temperature superconducting leads 2.8 electrically connect magnet coil 2.10 to the filter and the rectifier.

One preferred embodiment of the current source of the present invention, i.e., source 30, is shown in FIG. 3 and is powered by a DC power source 3.1. Current source 30 is split into a "room temperature" side and a "cryogenic" side. The room temperature side components, such as drive boards 3.2, inverter bridges 3.3, the primary windings, and the cores of transformers 3.5 are thermally linked to a room-temperature plate 3.4, which is, in turn, thermally linked to a vacuum chamber 3.15 and to the ambient environment. The rectifying MOSFETs 3.8 are thermally linked to a rectifying plate 3.7. The rectifying plate 3.7 is connected to a cold-head plate 3.12 by a thermal bridge 3.6. The output of the rectifier is filtered by a first-order superconducting AC filter comprised of a superconducting solenoid 3.9 and a cryogenically-compatible capacitor 3.8. The superconducting coil 3.11 is thermally linked to the cryo-head plate 3.12. A microcontroller 3.13 provides a gate signal sequence for the CSRC. The thermal bridge is comprised of copper foil and several high-temperature superconducting tapes soldered on top of the bridge. The bridge cross-section is calculated to ensure that the rectifying plate temperature stays below 70 K at the maximum current, which is the optimum operating temperature of a Si MOSFET and a safe operating temperature for the superconducting filter 3.9. According to FIG. 1.b, the optimum operating range for a Si MOSFET is from 60 to 75 K.

Figure 4A:
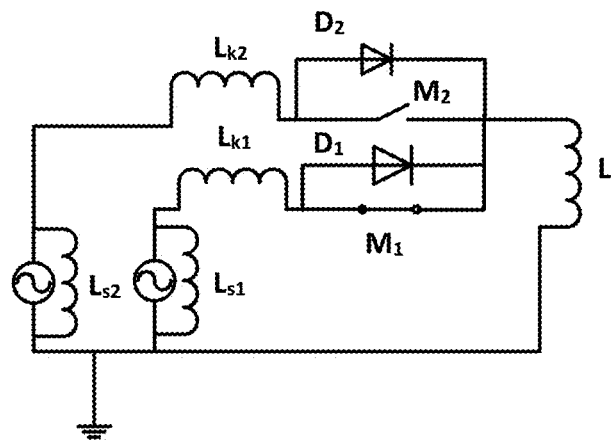
FIG. 4a is diagram of the inverter.

The simplified diagram shown in FIG. 4a explains the effect of magnetic energy from the leakage inductances Lk1 and Lk2 on the inverter performance. A simple two-phase device is shown. The leakage inductance originates from magnetic field flux lines that close through the air rather than through the transformer core and the primary winding. If the circuit does not specifically provide for a controlled discharge of the leakage inductance, the magnetic energy is dissipated through the body diode of the MOSFET (such as D2) once the channel is force-closed by the gate signal. In a traditional switching power supply, the leakage energy contribution is small because the secondary voltage is usually high (>>1 V). A parallel Schottky diode is sometimes used to further reduce dissipation through the body diode.

Figure 4B:
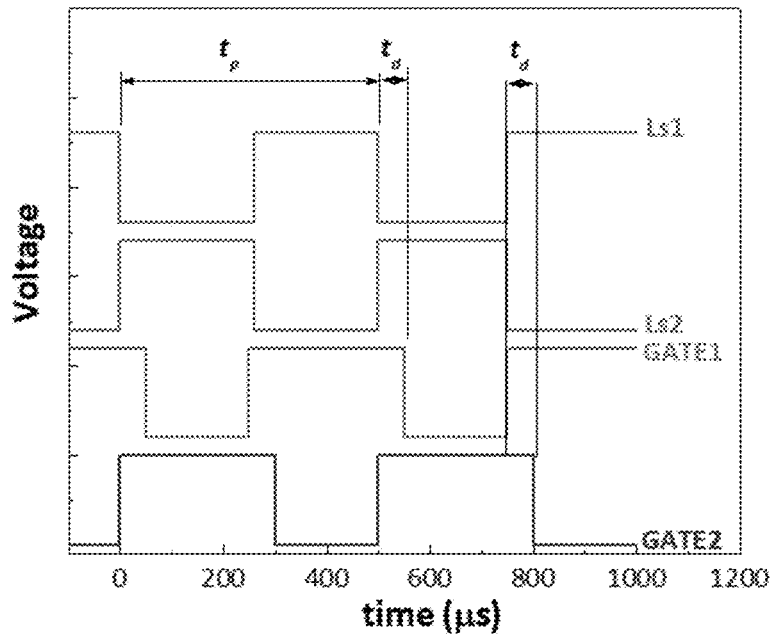
FIG. 4b is a signal diagram showing gate closing delay $t_d$ needed to prevent the leakage inductance Lk2 discharge through the body diode D2.

In order to prevent discharge of Lk2 through the body diode D2, a gate closing delay $t_d$ is introduced. The simplified two-phase diagram shown in FIG. 4b illustrates the delayed closing concept. The diagram describes the moment when a rectifying MOSFET is closed by negative gate voltage (delay time $t_d$=0), but the leakage inductance Lk2 still stores magnetic energy. Because the input voltage in a steady current mode is low (300 mV), the energy is mostly lost via diode D2 conduction. A Si diode at 77 K has a direct voltage drop of 1 V, generating 300 W of heat at 300 A until the leakage inductance is discharged. A simple estimate shows that if the delayed switching is not implemented, this loss mechanism would be responsible for approximately 37 W of thermal loss at 300 A, far exceeding the project target of 40 W at 1,000 A.

In this embodiment, the delayed adaptive switching is accomplished by an embedded controller. The controlled switching ensures that discharge events do not overlap and the leakage inductance is fully discharged before the MOSFET is open (zero-current opening) and the magnetic energy stored in Lk2 is used to charge Lk1 instead of being dissipated in the body diode.

However, in the steady state regime, when the current source needs to keep the coil current constant, the voltage on the superconducting coil 3.11 is practically zero. Therefore, the steady-state secondary voltage Vs is very low (<0.1 V). However, the secondary current $I_s$ is high, >1,00 A. The magnetic energy stored in the leakage inductance is $\sim L_s I^2$, while the energy in the secondary winding magnetization inductance $\sim V_s^2$. The time needed to discharge the leakage inductance is $t_d = L_s I/V_s$. One can infer from FIG. 4b that the switching frequency can only be increased to a point when $t_d$ is still less than the half-period ½f. Thus, a traditional prior art current source would be forced to reduce the switching frequency in the steady-state regime to accommodate the long discharge time. Indeed, a one-phase (single transformer) system built by Siemens (Oomen, M. P., et al., HTS flux pump for cryogen-free HTS magnets. IEEE Transactions on Applied Superconductivity, 2005. 15(2): p. 1465-1468) operated at 500 Hz. Such prior art current sources are very efficient but generate a very low frequency, <1 kHz, voltage ripple, which is impossible to filter, at least by a filter of practical size.

The present invention utilizes phase-shifted multi-phase inverters coupled to an array of small transformers with low leakage inductances and a compact superconducting AC filter. An array of small, low-current transformers is connected in parallel, thus the total current is a sum of small contributions of many, >5, phase-shifted current sources. In one embodiment, the current of a single transformer is limited 100 A. It has been discovered herein that a multi-phase approach reduces the leakage inductance by a factor of $1/n_p$, where $n_p$ is the number of phases. The transformer current is also reduced by the factor $1/n_p$. The leakage inductance discharge time is $\sim 1/I_s L_k \sim 1/n_p^2$. Therefore by increasing the number of phases from one to five, we would be able to increase the switching frequency f by a factor of $n_p$ 2=25. If we use a second-order filter with 40 dB per decade transfer function, the ripple amplitude is suppressed by $n_p^4$.

Figure 5:
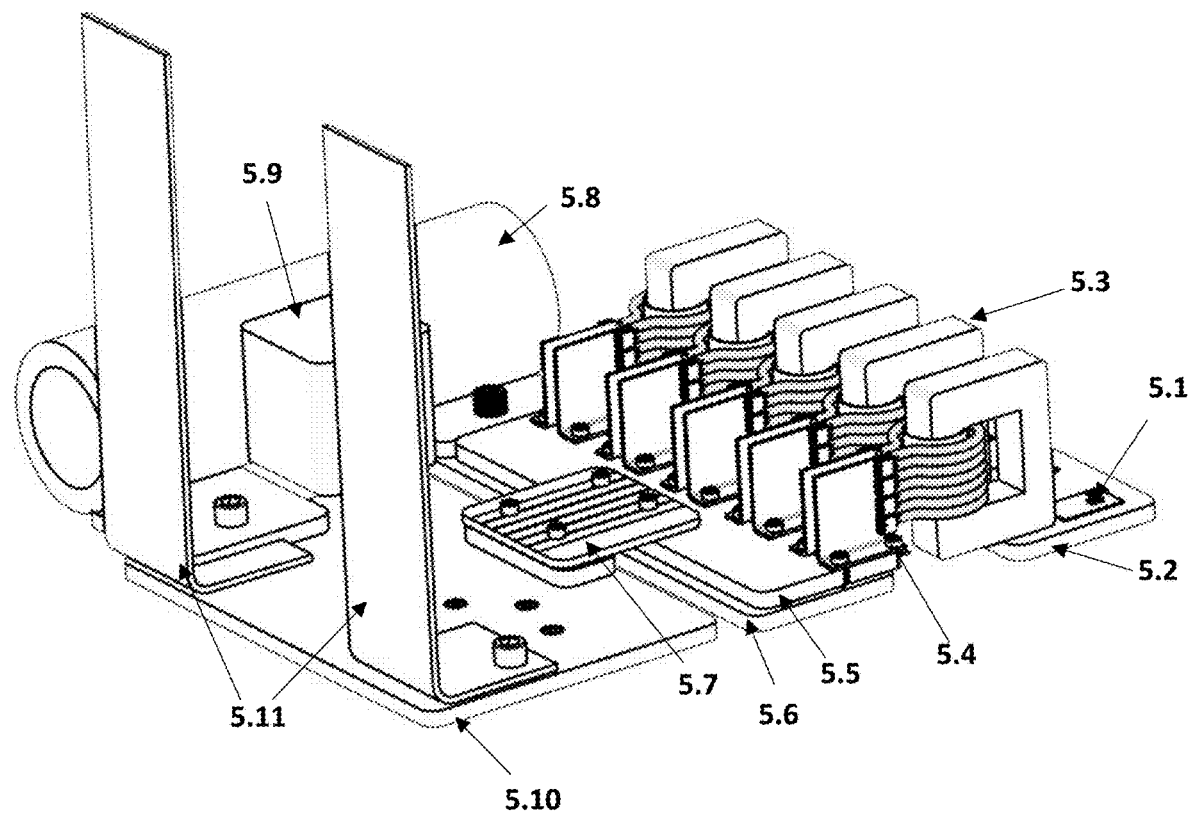
FIG. 5 is a mechanical rendering of a current source in accordance with the present invention.

A mechanical rendering of one preferred embodiment, i.e., a single-layer, 5 phase current source rated for 1,000 A, is shown in FIG. 5. Here, transformers 5.3 are thermally bonded to a room-temperature plate 5.2. The gate drivers 5.1 are also bonded to the room-temperature plate by a heat-conductive epoxy. The primary winding of each transformer 5.3 is insulated from its respective secondary winding by several layers of Super-Insulation (aluminum-coated Mylar). The Super-Insulation is wrapped around primary winding thus ensuring thermal insulation from the secondary winding, which is maintained at a cryogenic temperature. A bank of rectifying MOSFETs 5.4 is attached to the rectifying plate 5.5. The rectifying plate 5.5 is connected to a cold-head plate 5.10 via a thermal bridge 5.7. The thermal bridge 5.7 is manufactured from 1×50×50 mm copper plate. Three YBCO superconducting tapes are soldered to the copper plate to improve current capacity of the bridge. The middle points (current return) of the secondary windings are connected to a filter plate 5.6. The filter plate is connected to the filter solenoid 5.8, which is also coupled to a filter capacitor 5.9. The high-temperature superconducting current leads 5.11 deliver current to a magnet coil. The current lead 5.11 is made by soldering a second-generation superconducting tape (such as SuperPower Inc. 2G tape) on a ⅛" thick copper strip.

Figure 6:
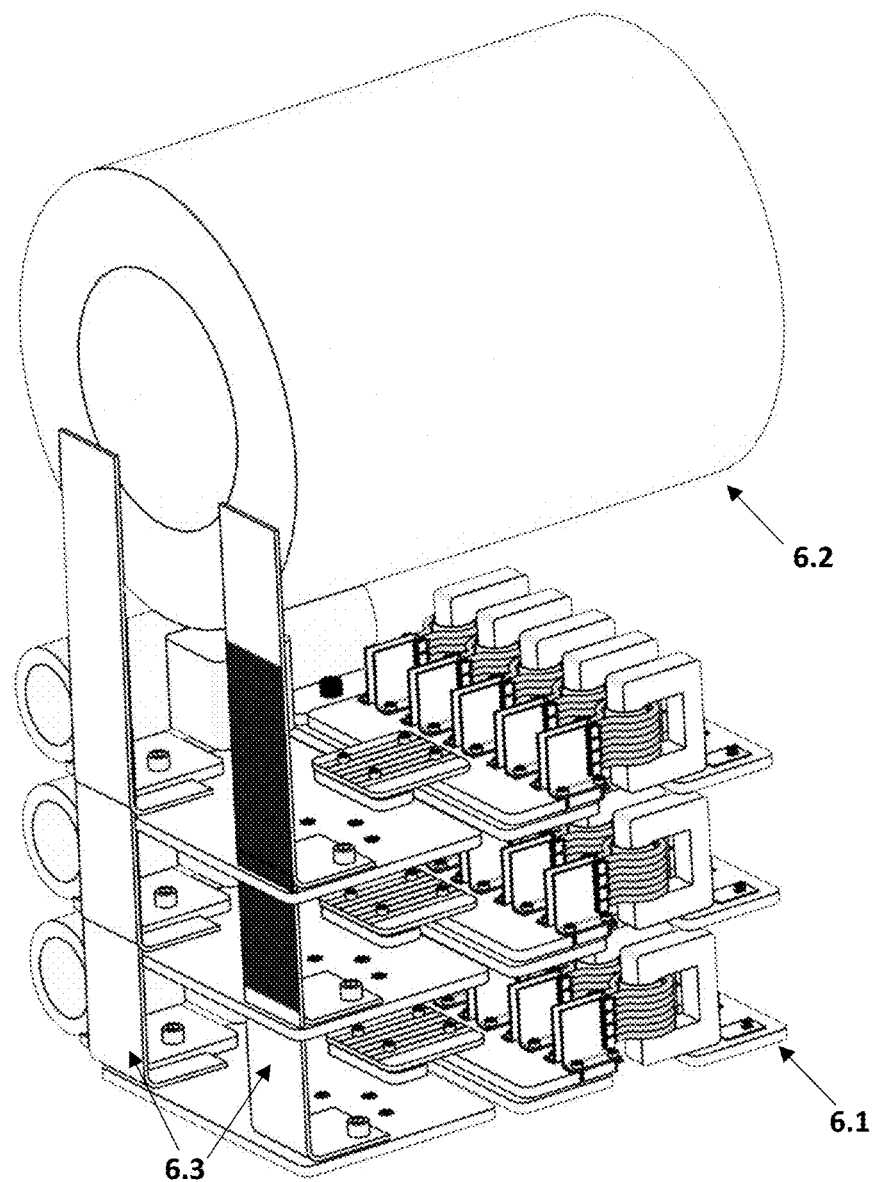
FIG. 6 is a mechanical rendering of a three-layer current source in accordance with the present invention.

It is impractical to make a single layer device with ratings >1,000 A. If a higher current rating is needed, multiple 1000 A layers may be connected in parallel. FIG. 6 is a mechanical rendering showing a three-layer current source rated for 3,000 A. The superconducting current leads 6.3 of each layer 6.1 are connected in parallel, exciting a superconducting solenoid 6.2.

Example 1

Figure 7A:
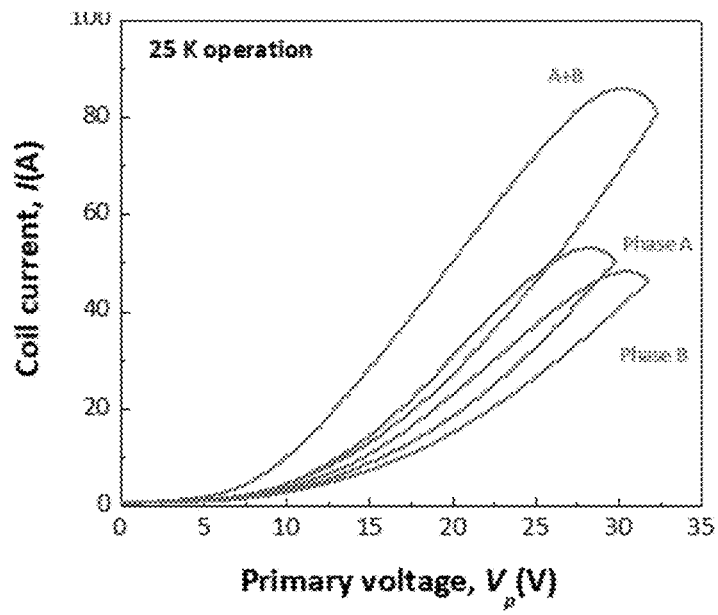
FIG. 7a is a graph showing current addition.
Figure 7B:
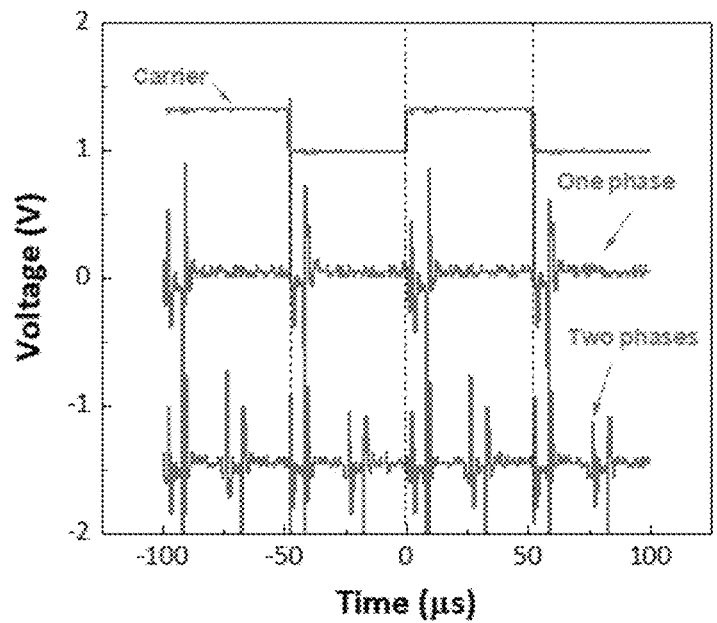
FIG. 7b is a graph showing ripple frequency doubling in a 2-phase inverter.

A two-phase device is assembled from two transformers 9 (Uncoated 77 Ferrite U cores (41×20 mm, 11.68 mm diameter)). The primary winding is wound from 100 turns of 24 gauge copper wire. The secondary winding is a single turn of 150 strands of 24 Gauge copper wire. The rectifier is assembled from three parallel AUIRFSA8409-7P Si MOSFETs (Infineon Technologies). The inverter and the rectifier gates are controlled by a microcontroller. The microcontroller generated the gate signal sequence. The current source powered a high-temperature superconducting coil. The coil winding was comprised of 220 turns of 12 mm wide superconducting tape (AMSC Corp. Amperium), the total coil inductance was 100 mH. The sustained 600 A at 77 K. FIG. 7a shows the summation of currents of two-phase units on an inductive load. Here, the total coil current is recorded as a function of the primary voltage. The two phases are approximately equivalent, each delivering 45 A at 30 V primary voltage, 25 K. When two phases are turned on, the total current doubles to 90 A. The additional benefit of the multi-phase approach is effective multiplication of the voltage ripple frequency as demonstrated in FIG. 7b. The transient voltages superimpose, resulting in the doubling of the switching noise spectrum when the two phases are turned on.

Example 2

A filter solenoid was manufactured from a stack of four 2 mm YBCO filaments coated with 10 microns of SnPb solder.

It is well known that AC fields incur losses in a superconductor which are proportional to the conductor width. A filter operates under 100's of mV of AC voltage at high frequency. A simple estimate shows that safe evacuation of heat dissipated due to AC loss requires a cable narrower than 2 mm. It is also known that due to inevitable defects present in the superconducting layer, the continuous length of a 2 mm wide 2G conductor is typically less than 10 meters, which is not enough for manufacturing a filter. A method described herein utilizes current sharing between the exfoliated filaments as explained in: Defect Tolerant High-Temperature Superconducting Cable for the Central Solenoid of Compact Fusion Reactor, V. Solovyov, Z. Mendleson and M. Takayasu, IEEE Transactions on Applied Superconductivity 2021 Vol. 31 Issue 5 Pages 1-5).

Briefly, a stack of filaments is electrically connected by re-flowing the solder coating. Electrically-connected filaments provide a current path around a current-blocking defect in the superconducting layer. The current is re-routed into neighboring filaments. The resulting cable is defect-tolerant; that is, it can sustain current-blocking defects at a density 1 defect per several meters. The defect-tolerance of the cable yields is critical for reliable operation of the filtering solenoid.

Figure 8A:
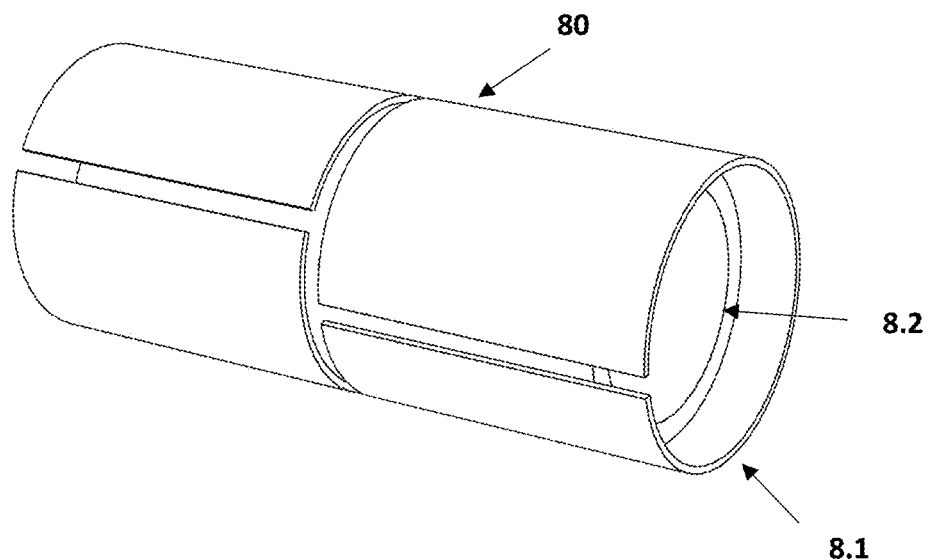
FIG. 8a is a perspective view of a filter solenoid coil form in accordance with the present invention.

FIG. 8a shows a coil form 80. The coil form is comprised of 100 mm OD G10 pipe 8.2 and two copper current leads 8.1 which also serve as conduits for cooling of the filter. A stack of tapes 8.3 is continuously laid on the coil form. A stream of air 8.4, pre-heated to 550° C. is directed to a point where the winding is touching the coil form. The stream of air heats the stack, instantly melting the solder and thus connecting the filaments. This method allows winding the relatively thick cable around a small-diameter coil form to form solenoid 81. The resultant solenoid 81 inductance is 13 µH A 2 mm wide exfoliated YBCO coupons manufactured from a standard 2G tape supplied by American Superconductor Corp. The exfoliated tapes, initially 10 mm wide, were sliced into 2 mm wide filaments by a fiber laser (STI 80 W model). Briefly, the filament can be described as a 1.2 micron thick YBCO layer attached to 75 micron thick copper foil. After the exfoliation step, the exposed YBCO surface was coated with a 1 micron layer of silver by magnetron sputtering. The filaments were coated with 10 microns of Sn63Pb47 solder by dip coating. A hot air stream controlled the solder thickness during the dip-coating process.

Figure 8B:
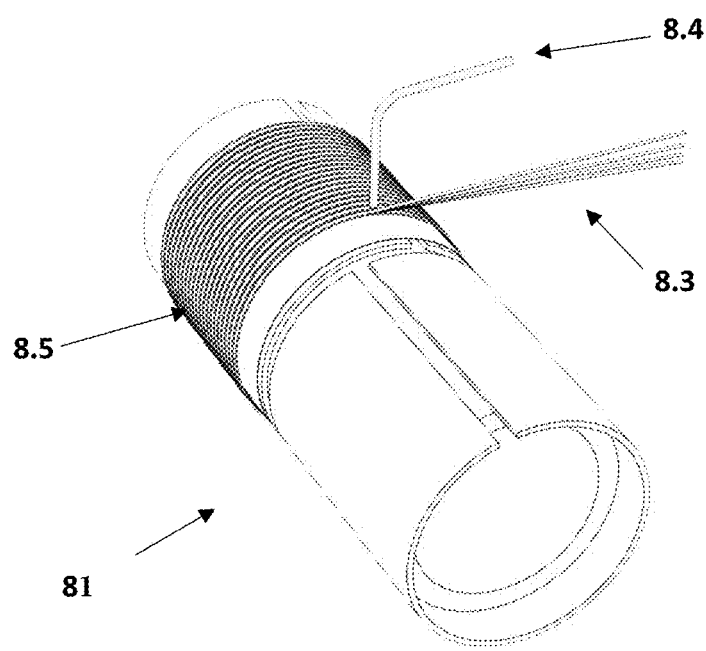
FIG. 8b shows a process of manufacturing the solenoid of FIG. 8a from a stack of exfoliated YBCO tapes.
Figure 9:
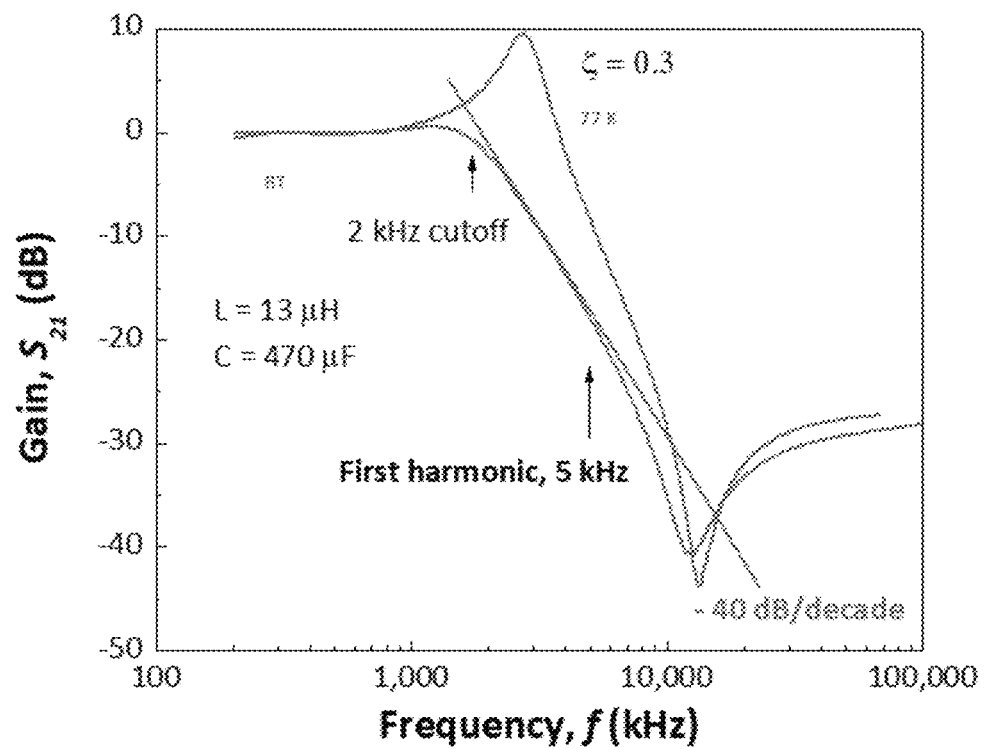
FIG. 9 is a graph showing the gain curve of a superconducting filter in accordance with the present invention at room temperature and 77 K.

FIG. 8b is a rendering of the cable fusion process. Here a stack of solder-coated tapes, "cable stack," is wound on a coil former. The hot air outlet, ¼" Inconel tubing., 8.4, delivered a compact stream of pre-heated air directly to the point where the tape stack 8.3 meets the coliform. A simple heat exchanger was constructed by placing four tubing turns inside a 0.5 meter long, 1,200 W resistive furnace. The furnace temperature was maintained at 700° C. The airstream exited with a temperature of 350° C., which was enough to melt the solder while not damaging the Kapton insulation. The advantage of this arrangement is that it predictably delivers a consistent and safe amount of energy. A one-stage second-order filter is manufactured by coupling solenoid 81 with a 470 mF capacitor. The capacitor, Vishay MKT1820747065 is a metallized polyester capacitor which has been previously tested at cryogenic environment. The gain curve of the filter at room temperature and 77 K is shown in FIG. 9. The filter demonstrated 40 bB/decade gain roll-off and 2 kHz cut-off frequency. Cooling the AC filter down to 77 K did not appreciably change the transmittance curve.

Example 3

Figure 10:
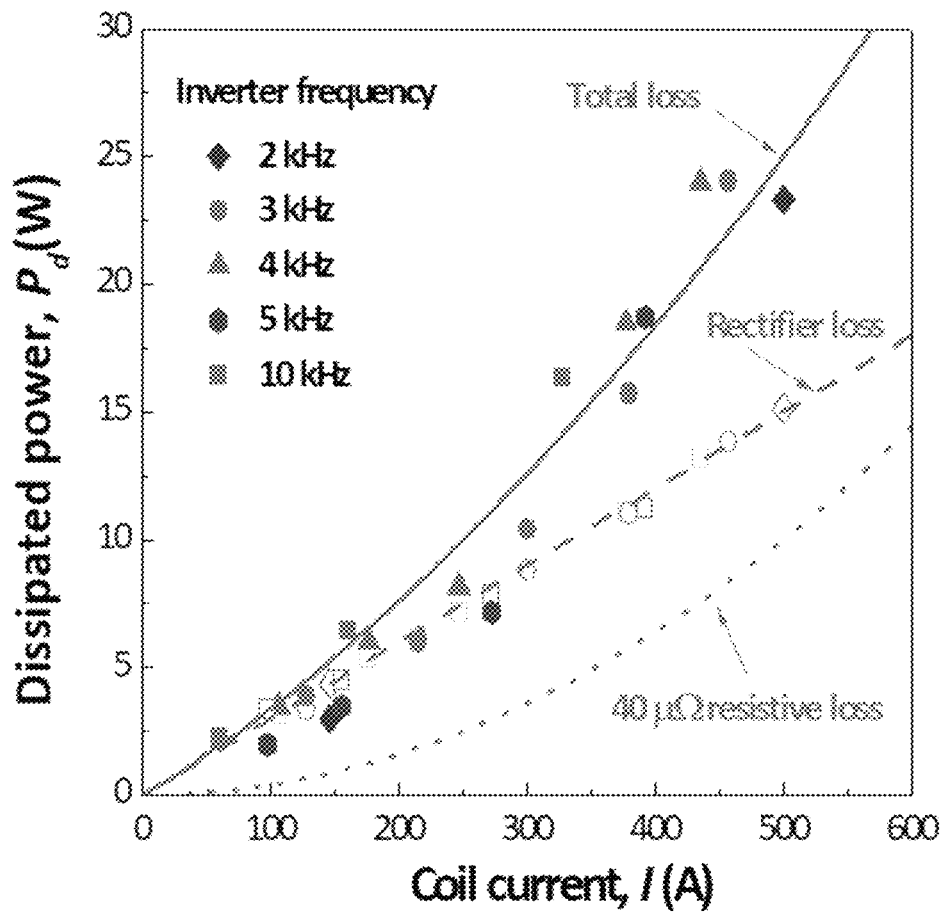
FIG. 10 is a graph showing the current dependence of the total loss of the source at 2, 3, 4, 5 and 10 kHz separated into the resistive (passive) loss and active (rectifier) loss components.

A four-phase current source was assembled following the mechanical design shown in FIG. 5. The transformer design is described in EXAMPLE 1 and the filter is described in EXAMPLE 2. The switching sequence of the controller is adapted to minimize the ripple. FIG. 10 depicts the total loss of the current source as a function of current at 2, 3, 4, 5 and 10 kHz switching frequency. Here, the total loss is presented as a sum of the rectifier loss and passive loss. The passive loss results from dissipation in interconnects and current leads. A traditional current lead design would dissipate approximately 40 W. This example shows that the invention needs 65% less cooling power.

Figure 11:
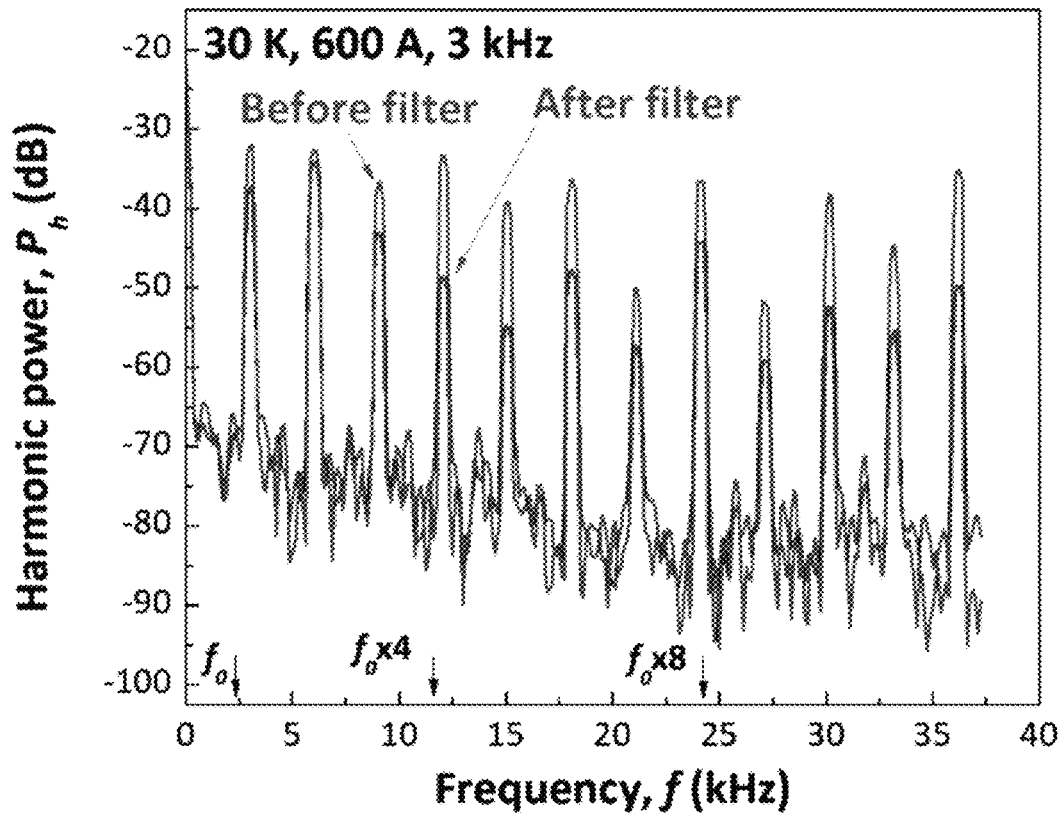
FIG. 11 is a graph showing the spectrum of the rectifier voltage before and after a filter.
Figure 12:
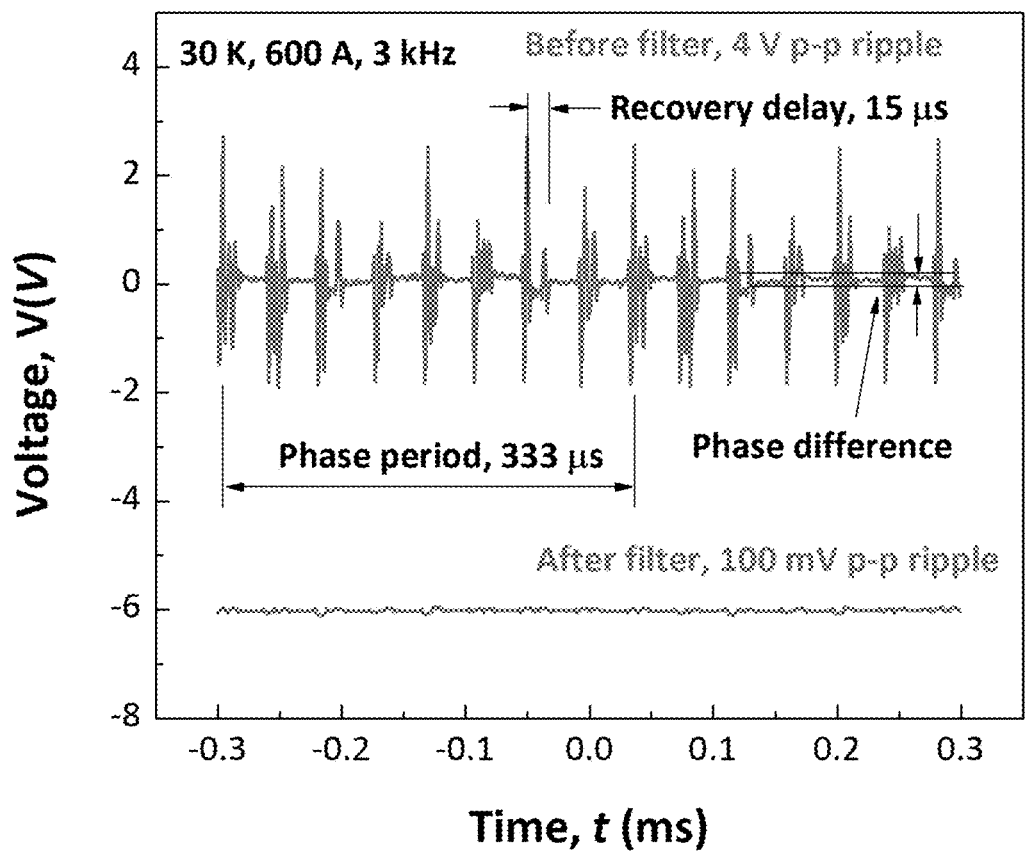
FIG. 12 is a graph showing the waveforms of an output of a five-phase rectifier operating at 600 A before and after a filter.
Figure 13:
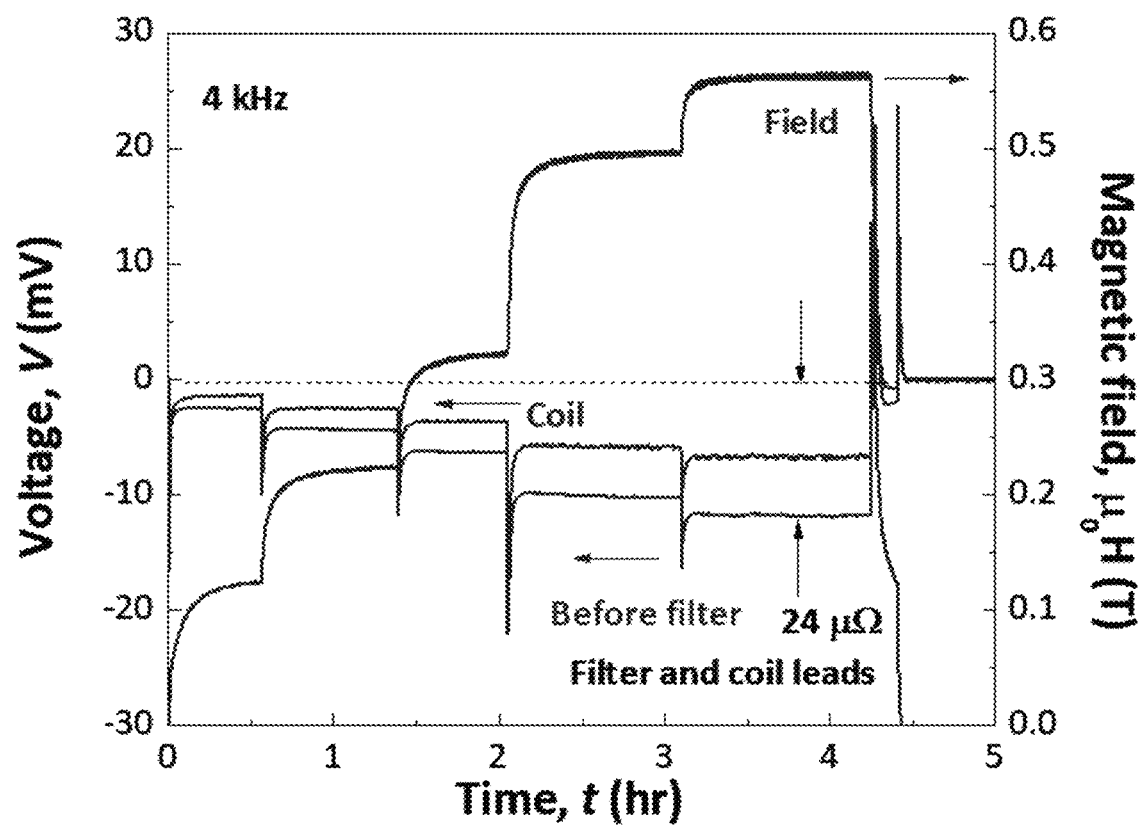
FIG. 13 is a graph showing the time dependence of magnetic field in the coil that is energized by the in-vacuum current source.

FIG. 11 is the current source output Fourier spectrum before and after the filter. The current source operates at 3 kHz. The filter delivers 40 bD suppression at 12 kHz, which is the strongest harmonic of the source. The same set of signals is shown in FIG. 12 as waveforms. The plot shows that the unfiltered rectifier output contains transient signals up to 1 V amplitude. After the filter, the unwanted RF signal amplitude is suppressed below 100 mV. Finally, FIG. 13 shows the time profile of the magnetic field in the magnet bore and DC voltages below and after the filter. At a maximum current of 600 A the coil delivered 0.55 T. Due to effective filtering, the DC voltage on the magnet has a noise level <1 mV.

It will be appreciated that the present invention has been described herein with reference to certain preferred or exemplary embodiments. The preferred or exemplary embodiments described herein may be modified, changed, added to or deviated from without departing from the intent, spirit and scope of the present invention, and it is intended that all such additions, modifications, amendments and/or deviations be included in the scope of the present invention.

What is claimed is:

1. An in-vacuum current source for powering a conduction cooled superconducting magnet via a DC power source providing a low-current, high-voltage DC signal, comprising:
   a first current source unit, said first current source unit comprising:
      an inverter coupled to said DC power source for generating a high-frequency high-voltage AC signal from said low-current, high-voltage DC signal;
      a plurality of step-down transformers coupled to said inverter for stepping down the voltage of said AC signal;
      a cryogenic synchronous rectifier circuit coupled to said transformers for receiving and rectifying said stepped-down AC signal;
      a superconducting electromagnetic emission filter positioned between said cryogenic synchronous rectifier circuit and said superconducting magnet for reducing AC ripple and maintaining voltage ripple below 100 mV; and
   a pair of high temperature superconducting leads for electrically connecting said superconducting magnet to said filter and to said cryogenic synchronous rectifier circuit, and
      further comprising a vacuum environment and a cryogenic environment, and
      further comprising a copper-superconducting composite to thermally link said cryogenic synchronous rectifier circuit to said cryogenic environment to maintain said cryogenic synchronous rectifier circuit at a temperature of greater than 65 K at maximum current.

2. The current source according to claim 1, wherein said transformers comprise a gate driving circuit, a primary winding and a core, and wherein said gate driving circuit, said primary winding and said core are located in said vacuum environment and thermally linked to a wall of said vacuum environment and thus to the ambient.

3. An in-vacuum current source for powering a conduction cooled superconducting magnet via a DC power source providing a low-current, high-voltage DC signal, comprising:
   a first current source unit, said first current source unit comprising:
      an inverter coupled to said DC power source for generating a high-frequency high-voltage AC signal from said low-current, high-voltage DC signal;
      a plurality of step-down transformers coupled to said inverter for stepping down the voltage of said AC signal;
      a cryogenic synchronous rectifier circuit coupled to said transformers for receiving and rectifying said stepped-down AC signal;
      a superconducting electromagnetic emission filter positioned between said cryogenic synchronous rectifier circuit and said superconducting magnet for reducing AC ripple and maintaining voltage ripple below 100 mV; and
   a pair of high temperature superconducting leads for electrically connecting said superconducting magnet to said filter and to said cryogenic synchronous rectifier circuit, and
      wherein said filter comprises a superconducting solenoid, said solenoid comprising:
      a narrow high-temperature superconducting tape wrapped about a coil form; and
      a metallized polymer film capacitor.

4. An in-vacuum current source for powering a conduction cooled superconducting magnet via a DC power source providing a low-current, high-voltage DC signal, comprising:
   a first current source unit, said first current source unit comprising:
      an inverter coupled to said DC power source for generating a high-frequency high-voltage AC signal from said low-current, high-voltage DC signal;
      a plurality of step-down transformers coupled to said inverter for stepping down the voltage of said AC signal;
      a cryogenic synchronous rectifier circuit coupled to said transformers for receiving and rectifying said stepped-down AC signal;
      a superconducting electromagnetic emission filter positioned between said cryogenic synchronous rectifier circuit and said superconducting magnet for reducing AC ripple and controlling voltage ripple; and
   a pair of high temperature superconducting leads for electrically connecting said superconducting magnet to said filter and to said cryogenic synchronous rectifier circuit; and
      further comprising a vacuum environment and a cryogenic environment, and
      further comprising a copper-superconducting composite to thermally link said cryogenic synchronous rectifier circuit to said cryogenic environment to maintain said cryogenic synchronous rectifier circuit at a temperature of greater than 65 K at maximum current.

5. The current source according to claim 4, wherein said transformers comprise a gate driving circuit, a primary winding and a core, and wherein said gate driving circuit, said primary winding and said core are located in said vacuum environment and thermally linked to a wall of said vacuum environment and thus to the ambient.

6. An in-vacuum current source for powering a conduction cooled superconducting magnet via a DC power source providing a low-current, high-voltage DC signal, comprising:
   a first current source unit, said first current source unit comprising:
      an inverter coupled to said DC power source for generating a high-frequency high-voltage AC signal from said low-current, high-voltage DC signal;
      a plurality of step-down transformers coupled to said inverter for stepping down the voltage of said AC signal;
      a cryogenic synchronous rectifier circuit coupled to said transformers for receiving and rectifying said stepped-down AC signal;
      a superconducting electromagnetic emission filter positioned between said cryogenic synchronous rectifier circuit and said superconducting magnet for reducing AC ripple and controlling voltage ripple; and
   a pair of high temperature superconducting leads for electrically connecting said superconducting magnet to said filter and to said cryogenic synchronous rectifier circuit;
   wherein said filter comprises a superconducting solenoid, said solenoid comprising:
      a narrow high-temperature superconducting tape wrapped about a coil form; and
      a metallized polymer film capacitor.

* * * * *